US009651636B2

(12) United States Patent
Fu et al.

(10) Patent No.: US 9,651,636 B2
(45) Date of Patent: May 16, 2017

(54) SINGLE-CHIP THREE-AXIS MAGNETIC FIELD SENSING DEVICE

(71) Applicant: Voltafield Technology Corp., Zhubei, Hsinchu County (TW)

(72) Inventors: Nai-Chung Fu, Zhongli (TW); Fu-Tai Liou, Zhubei (TW); Jia-Mou Lee, New Taipei (TW)

(73) Assignee: Voltafield Technology Corp., Zhubei (TW)

( * ) Notice: Subject to any disclaimer, the term of this patent is extended or adjusted under 35 U.S.C. 154(b) by 124 days.

(21) Appl. No.: 14/013,091

(22) Filed: Aug. 29, 2013

(65) Prior Publication Data

US 2015/0008913 A1    Jan. 8, 2015

(30) Foreign Application Priority Data

Jul. 5, 2013   (TW) .............................. 102124118 A

(51) Int. Cl.
*G01R 33/09*        (2006.01)
(52) U.S. Cl.
CPC .................................. *G01R 33/096* (2013.01)
(58) Field of Classification Search
CPC   G01R 33/096; G01R 33/093; G01R 33/0005; G01R 33/0052; G01R 33/0206; G01R 33/07; B82Y 25/00; G01D 11/245; G01D 5/147; H05H 7/04
USPC .................. 324/252, 260, 247, 202; 257/421
See application file for complete search history.

(56) References Cited

U.S. PATENT DOCUMENTS

| | | | |
|---|---|---|---|
| 2005/0270020 A1* | 12/2005 | Peczalski et al. ............ | 324/247 |
| 2009/0108841 A1* | 4/2009 | Abe et al. ...................... | 324/252 |
| 2009/0315554 A1* | 12/2009 | Witcraft et al. .............. | 324/260 |
| 2012/0212218 A1* | 8/2012 | Fu et al. ........................ | 324/252 |
| 2013/0082697 A1* | 4/2013 | Fu et al. ........................ | 324/252 |
| 2013/0082699 A1* | 4/2013 | Fu et al. ........................ | 324/252 |
| 2013/0265039 A1* | 10/2013 | Cai et al. ...................... | 324/252 |

* cited by examiner

*Primary Examiner* — Son Le
*Assistant Examiner* — Akm Zakaria
(74) *Attorney, Agent, or Firm* — Alan D. Kamrath; Kamrath IP Lawfirm, P.A.

(57) ABSTRACT

A single-chip three-axis magnetic field sensing device is provided. This single-chip three-axis magnetic field sensing device comprises a substrate, a first sensing module, a second sensing module, a third sensing module and at least one coil. The substrate includes a surface. The first sensing module comprises at least one first magnetoresistive element and is configured to sense a first magnetic field component substantially parallel to the surface. The second sensing module comprises at least one second magnetoresistive element and is configured to sense a second magnetic field component substantially parallel to the surface. The third sensing module comprises at least one third magnetoresistive element and is configured to sense a third magnetic field component substantially perpendicular to the surface. Wherein one of the first magnetoresistive element and the second magnetoresistive element and the third magnetoresistive element is disposed right above or right below the at least one coil.

21 Claims, 14 Drawing Sheets

SINGLE-CHIP THREE-AXIS MAGNETIC FIELD SENSING DEVICE

FIELD OF THE INVENTION

The present invention relates to a magnetic field sensing device, and particularly to a single-chip three-axis magnetic field sensing device.

BACKGROUND OF THE INVENTION

As shown in FIG. 1, a traditional magnetic field sensing device 100 is primarily composed of four magnetoresistive elements 120, 130, 140 and 150 electrically arranged to form a wheatstone bridge circuit. It is possible to measure the level of a magnetic filed substantially parallel to a substrate by reading the voltage value of the voltmeter 160. However, the traditional magnetic field sensing device could only measure the level of a magnetic field of a single direction substantially parallel to the substrate (that is X-axis or Y-axis direction) but could not measure the level of a magnetic field of a direction substantially perpendicular to the substrate (that is Z-axis).

Although with the technology nowadays it is possible to integrate two magnetic field sensing devices respectively configured to measure two magnetic fields of different axes substantially parallel to the substrate into the same substrate, these two axes are limited to X-axis and Y-axis. No publications have shown that magnetic field sensing devices respectively configured to sense X-axis, Y-axis and Z-axis can be integrated into the same substrate while preventing the performance of the Z-axis magnetic field sensing device being affected by the X-axis magnetic field or the Y-axis magnetic field.

Therefore, there is a need to propose a device on a single substrate that is capable of sensing X-axis, Y-axis and Z-axis magnetic fields so as to improve simplicity, integration and sensing precision of the magnetic sensing device.

SUMMARY OF THE INVENTION

One embodiment of the present invention provides a single-chip three-axis magnetic field sensing device which comprises: a substrate comprising a surface; first sensing module comprising at least one first magnetoresistive element and configured to sense a first magnetic field component substantially parallel to the surface; second sensing module comprising at least one second magnetoresistive element and configured to sense a second magnetic field component substantially parallel to the surface; third sensing module comprising at least one third magnetoresistive element and configured to sense a third magnetic field component substantially perpendicular to the surface; and at least one coil, wherein one of the first magnetoresistive element, the second magnetoresistive element and the third magnetoresistive element is disposed right above or right below the at least one coil and the at least one coil is configured to set a magnetization direction of the magnetoresistive element right above or right below it.

Another embodiment of the present invention provides a single-chip three-axis magnetic field sensing device comprising: a substrate including a surface; a first sensing module, disposed above the substrate, comprising at least one first magnetoresistive element and configured to sense a first magnetic field component substantially parallel to the surface; a second sensing module, disposed above the substrate, comprising at least one second magnetoresistive element and configured to sense a second magnetic field component substantially parallel to the surface; a third sensing module, disposed above the substrate, comprising at least one third magnetoresistive element and configured to sense a third magnetic field component substantially perpendicular to the surface. The third sensing module comprises: a strip of horizontal magnetoresistive layer being substantially parallel to the surface; a conductive part disposed above or below the horizontal magnetoresistive layer and electrically coupled thereto, wherein a length direction of the conductive part is not parallel to a length direction of the horizontal magnetoresistive layer; and a magnetic-field-sensing layer being not parallel to the surface and extending upward or downward from one side of the horizontal magnetoresistive layer so as to magnetically couple to the horizontal magnetoresistive layer.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
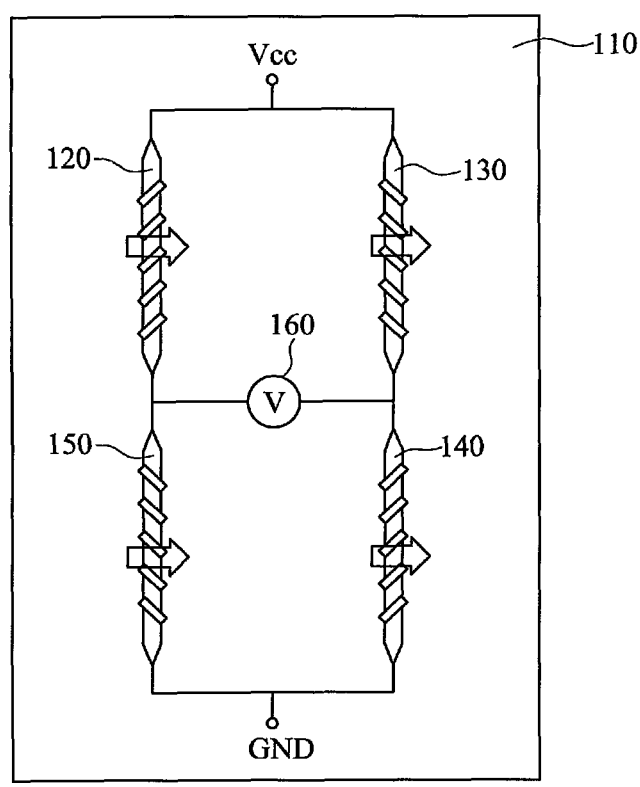
FIG. 1 schematically illustrates a traditional magnetic field sensing device.

The present invention focuses on a Z-axis magnetoresistive sensing element, particularly single-chip three-axis magnetic field sensing devices comprising such Z-axis magnetoresistive sensing element. The single-chip three-axis magnetic field sensing devices of the present invention is capable of sensing X-axis, Y-axis and Z-axis magnetic fields at the same time and may further comprise other common structures such as set/reset circuit, various kinds of circuitries such as amplifier, filter, converter . . . etc., shield for shielding unwanted electrical and/or magnetic signals. To explain the present invention clearly and completely without obscurity, the commonly used structures are simply put without detailed explanations. It is noted that in the following context the single-chip three-axis magnetic field sensing devices of the present invention may also be referred to as three-axis magnetic field sensing devices or even magnetic field sensing devices for short.

The following descriptions illustrate preferred embodiments of the present invention in detail. All the components, units, sub-portions, structures, materials and arrangements therein can be arbitrarily combined in any sequence despite their belonging to different embodiments and having different sequence originally. All these combinations are falling into the scope of the present invention. A person of ordinary skills in the art, upon reading the present invention, can change and modify these components, units, sub-portions, structures, materials and arrangements therein without departing from the spirits and scope of the present invention. These changes and modifications should fall in the scope of the present invention defined by the appended claims.

There are a lot of embodiments and figures within this application. To avoid confusions, similar components are designated by the same or similar numbers. To simplify figures, repetitive components are only marked once. The purpose of figures is to convey concepts and spirits of the present invention, so all the distances, sizes, scales, shapes and connections are explanatory and exemplary but not realistic. Other distances, sizes, scales, shapes and connections that can achieve the same functions or results in the same way can be adopted as equivalents.

In the context of the present invention, "magnetic-field-sensing layer" or "magnetic-field-guiding layer" is composed by magnetic materials and "magnetoresistive layer" is also composed by magnetic materials, especially discrete or continuous single layer or multiple layers whose resistance would change according to a change of an external magnetic field. For example, the magnetic material may comprise an anisotropic magnetoresistive material (AMR), a giant magnetoresistive material (GMR) and a tunneling magnetoresistive material (TMR), a ferromagnet material, an antiferromagnet material, a nonferromagnet material or a tunneling oxide or any combination thereof. "Magnetic-field-sensing layer" or "magnetoresistive layer" or "magnetic-field-guiding layer" preferably comprises anisotropic magnetoresistive material (AMR) especially Permalloy. In the context of the present invention, the descriptive term "sensing" or "guiding" added before components is used to explain certain function/effect performed/achieved by such components when the magnetoresistive sensing element senses an external magnetic field of a specific direction. When a change is made to the direction of the external magnetic field (for example becoming opposite direction), the function/effect performed/achieved by such elements may change or switch. Therefore, the descriptive term "sensing" or "guiding" added before elements should not limit the function/effect of such elements. In the context of the present invention, the term "conductive strips", "conductive part" or "interconnect" represents a conductive structure with any shape capable of conducting electricity. It may comprise a metal, an alloy, a silicide, nanotubes, a conductive carbon material, doped silicon. As its structure, it may take a form of strip, concrete islands, sheet, via, single damascene or dual damascene structures, or a combination thereof along horizontal or vertical direction. In the context of the present invention, the term "magnetic field" or "magnetic field of a specific direction" represents a net magnetic field at a specific location taking effect of magnetic fields from different sources or a magnetic field at a specific location from a specific source without considering other sources or a magnetic component of a specific direction.

In the context of the present invention, the phrase "A is magnetically coupled to B" means magnetic flux lines going through one of A and B would be affected by the other of A and B, thereby redirecting or concentrating the magnetic flux lines. Therefore, the phrase "A is magnetically coupled to B" can represent a situation where A is in physical contact with B or a situation where A and B are close enough to magnetically affect each other without physically contacting each other. In the context of the present invention, the phrase "A is electrically coupled to B" means electrical current can flow from one of A and B to the other of A and B, so "A is electrically coupled to B" can represent a situation where A is in physical contact with B or a situation where there is one or more conductive structure/substance between A and B so as to make electrical communication occurs between A and B.

In the context of the present invention, the phrase "A is substantially parallel or substantially perpendicular to B" means the included angle between A and B is almost 180 degree or 90 degree, but due to design considerations or process deviations the included angle may differ from 180 degree or 90 degree by 1, 2, 3, 4, 5, 6, 7, 8 degrees or by this range. Such angle difference may be compensated by circuitry, composition of vectors or other method so the sensed result can match reality as better as possible.

Figure 2A:
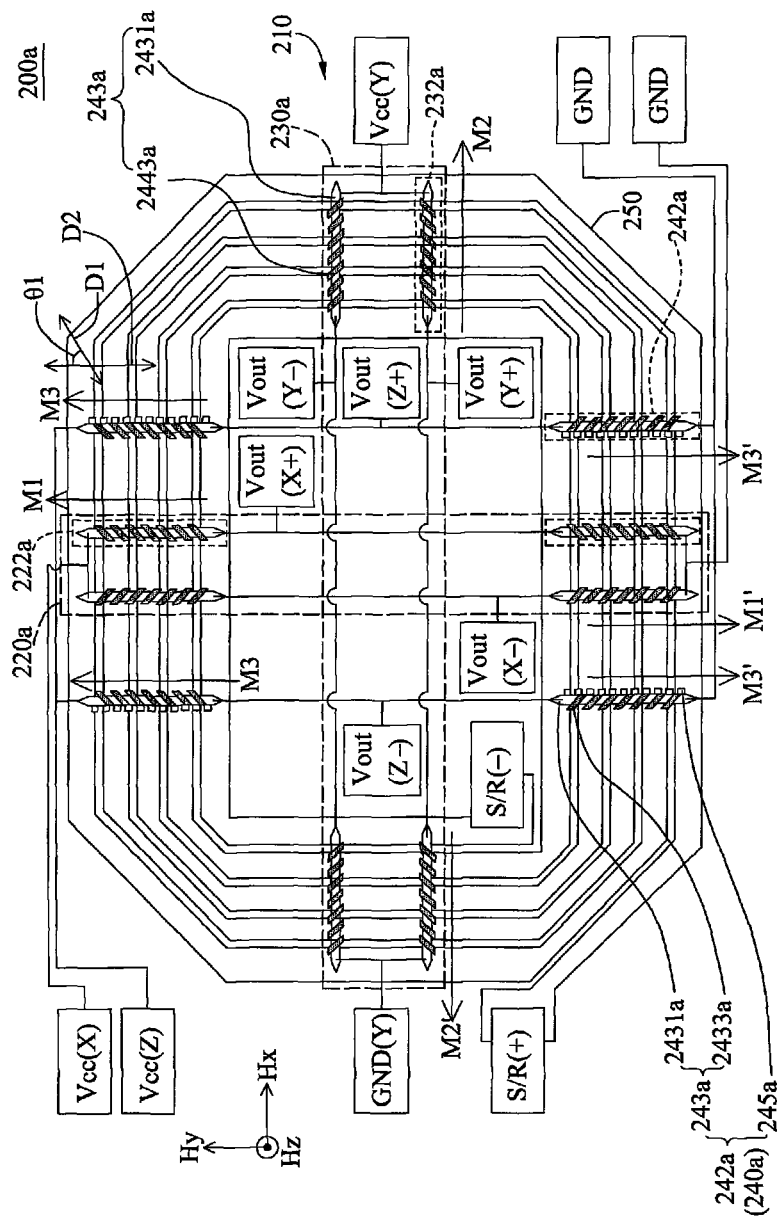
FIG. 2A schematically illustrates the structure of a single-chip three-axis magnetic field sensing device with a coil according to one embodiment of the present invention.

FIG. 2A schematically illustrates the structure of a single-chip three-axis magnetic field sensing device with a coil according to one embodiment of the present invention. Please refer to FIG. 2A, the single-chip three-axis magnetic field sensing device 200a comprises a substrate 210, a first sensing module 220a, a second sensing module 230a, a third sensing module 240a and at least one coil 250. The coil 250 is disposed above the substrate 210 and substantially parallel to a surface of the substrate 210. The first sensing module 220a, the second sensing module 230a and the third sensing module 240a are all disposed right above the coil 250.

The first sensing module 220a is configured to sense a first magnetic field component Hx substantially parallel to the surface of the substrate 210 such as X-axis magnetic field component. The first sensing module 220a at least comprises a first magnetoresistive element 222a. The first magnetoresistive element 222 has a first magnetization direction M1 or M1' substantially parallel to the surface of the substrate 210. In a preferred embodiment, the first magnetization direction M1 or M1' is substantially perpendicular to the first magnetic field component Hx.

The second sensing module 230a is configured to sense a second magnetic field component Hy substantially parallel to the surface of the substrate 210 such as Y-axis magnetic field component. The second sensing module 230a at least comprises a second magnetoresistive element 232a. The second magnetoresistive element 232a has a second magnetization direction M2 or M2'. The second magnetization direction M2 or M2' is substantially perpendicular to the first magnetization direction M1 or M1' and substantially parallel to the surface of the substrate 210. In a preferred embodiment, the second magnetization direction M2 or M2' is substantially perpendicular to the second magnetic field component Hy.

The third sensing module 240a is configured to sense a third magnetic field component Hz substantially perpendicular to the surface of the substrate 210 such as Z-axis magnetic field component. The third sensing module 240a at least comprises a third magnetoresistive element 242a. The third magnetoresistive element 242a has a third magnetization direction M3 or M3'. The third magnetization direction M3 or M3' is substantially parallel to the surface of the substrate 210 and substantially perpendicular to the third magnetic field component Hz. In this embodiment, the first sensing module 220a and the third sensing module 240a are juxtaposed.

Each of the first magnetoresistive element 222a, the second magnetoresistive element 232a and the third magnetoresistive element 242a comprise a magnetic sensing unit 243a. The magnetic sensing unit 243a comprises a horizontal magnetic structure 2431a and conductive structure 2433a, wherein the horizontal magnetic structure 2431a is above the substrate 210 and substantially parallel to the surface of the substrate 210 while the conductive structure 2433a is for example above or below the horizontal magnetic structure 2431a and electrically coupled thereto. In a preferred embodiment, the horizontal magnetic structure 2431a and the conductive structure 2433a are in direct physical contact. Furthermore, the length direction D1 of the conductive structure 2433a and the length direction D2 of the horizontal magnetic structure 2431a have an included angle θ1 larger than zero and smaller than 90 degree. It is worth mentioning that the length direction D2 of the horizontal magnetic structure 2431a for example is substantially perpendicular to the spiral path of the coil 250 and θ1 for example is 45 degree or the supplementary angle for 45 degree. It is noted that the length direction D1 of the conductive structure 2433a may vary according to different magnetization directions of different magnetoresistive elements and its location. The resistivity of the conductive structure 2433a is so chosen to be smaller than the resistivity of the horizontal magnetic structure 2431a, hence the conductive structure 2433a serves to change a direction of an electrical current flowing in the horizontal magnetic structure 2431a. The horizontal magnetic structure 2431a of the first magnetoresistive element 222a is configured to produce a resistance change in response to a change of the first magnetic field component Hx of an external magnetic field; the horizontal magnetic structure 2431a of the second magnetoresistive element 232a is configured to produce a resistance change in response to a change of the second magnetic field component Hy of an external magnetic field; the horizontal magnetic structure 2431a of the third magnetoresistive element 242a is configured to produce a resistance change in response to a change of the third magnetic field component Hz of an external magnetic field.

The substrate 210 may comprise other circuitries such as an Application-Specific Integrated Circuit (ASIC, not shown) used to receive, amplify and calculate the output of the first sensing module 220a, the second sensing module 230a and the third sensing module 240a.

Moreover, the third magnetoresistive element 242a further comprises at least one magnetic field direction adjusting unit 245a disposed above the substrate 210 and at least one side of the horizontal magnetic structure 2431a of the third magnetoresistive element 242a. For example, the magnetic field direction adjusting unit 245a may be a vertical portion of a magnetic structure or a magnetic flux guiding structure. The vertical portion of a magnetic structure (now shown in figures) may be formed on an inner sidewall of a trench, on an outer sidewall of a block, on multiple inner sidewalls of multiple trenches, on multiple outer sidewalls of multiple blocks, or a combination thereof. The magnetic field direction adjusting unit 245a is configured to concentrate magnetic flux of the third magnetic field component Hz and redirect/guide it to be substantially parallel to the surface of the substrate 210, so the horizontal magnetic structure 2431a of the third magnetoresistive element 242a may change its resistance accordingly.

It is worth mentioning that said coil 250 runs from the inner set/reset low voltage terminal (S/R−) to the outer set/reset high voltage terminal (S/R+) clockwisely along a spiral path. The coil 250 is configured to set the first magnetization direction M1 or M1', the second magnetization direction M2 or M2' and the third magnetization direction M3 or M3'. Since the coils shown in FIGS. 2A-2E share the same shape, arrangement and terminal voltages, their detailed descriptions will be omitted to save repetition. When the coil 250 is disposed right under the magnetoresistive elements, the first magnetization direction M1 or M1', the second magnetization direction M2 or M2' and the third magnetization direction M3 or M3' would be set as pointing inside out and substantially perpendicular to the spiral path. But When the coil 250 is disposed right above the magnetoresistive elements, the first magnetization direction M1 or M1', the second magnetization direction M2 or M2' and the third magnetization direction M3 or M3' would be set as pointing in and substantially perpendicular to the spiral path. It is noted that the shape of the coil of the present invention is not limited to octangle shape and it could take forms of any polygons such as rectangle, corner-rounded rectangle and even circle. The magnetoresistive elements may be distributed right below or above the coil with almost equal spacing therebetween.

In the embodiment shown in FIG. 2A, in the third sensing module 240a, two third magnetoresistive elements 242a disposed at the upper portion of the coil 250 and the other two third magnetoresistive elements 242a disposed at the bottom portion of the coil 250 have the third magnetization directions M3 and M3' pointing out the spiral path respectively; in the second sensing module 230a, two second magnetoresistive elements 232a disposed at the right portion of the coil 250 and the other two second magnetoresistive elements 232a disposed at the left portion of the coil 250 have the second magnetization directions M2 and M2' pointing out the spiral path respectively; in the first sensing module 220a, two first magnetoresistive elements 222a disposed at the upper portion of the coil 250 and the other two first magnetoresistive elements 222a disposed at the bottom portion of the coil 250 have the first magnetization directions M1 and M2' pointing out the spiral respectively.

Moreover, the first sensing module 220a of the single-chip three-axis magnetic field sensing device of the present invention for example may comprise a wheatstone bridge circuit that comprises four or a multiple of four first magnetoresistive elements 222a; the second sensing module 230a of the single-chip three-axis magnetic field sensing device of the present invention for example may comprise a wheatstone bridge circuit that comprises four or a multiple of four second magnetoresistive elements 232a; the third sensing module 240a of the single-chip three-axis magnetic field sensing device of the present invention for example may comprise a wheatstone bridge circuit that comprises four or a multiple of four third magnetoresistive elements 242a. FIG. 2A is a specific example for the single-chip three-axis magnetic field sensing device 200a which comprises three wheatstone bridge circuits consisted of four first magnetoresistive elements 222a, four second magnetoresistive elements 232a and four third magnetoresistive elements 242a respectively.

Although the third magnetization direction M3 or M3' of the third magnetoresistive element 242a could be any directions substantially perpendicular to the Z-axis magnetic field component, the third magnetization direction M3 or M3' should point inside out the spiral path and be substantially perpendicular to the spiral path of the coil 250. Therefore, the third magnetoresistive element 242a could be disposed at different portions of the coil 250 and its magnetization direction would change accordingly. In this embodiment, within the third sensing module, for all the third magnetoresistive elements 242a, two of them share the third magnetization direction M3 and the other two of them share the third magnetization direction M3', and the third magnetization direction M3' is opposite to the third magnetization direction M3. That is, the third magnetization direction M3' forms an angle of 180 degree with respect to the third magnetization direction M3. But the third sensing module of the present invention is not limited thereto.

Figure 2B:
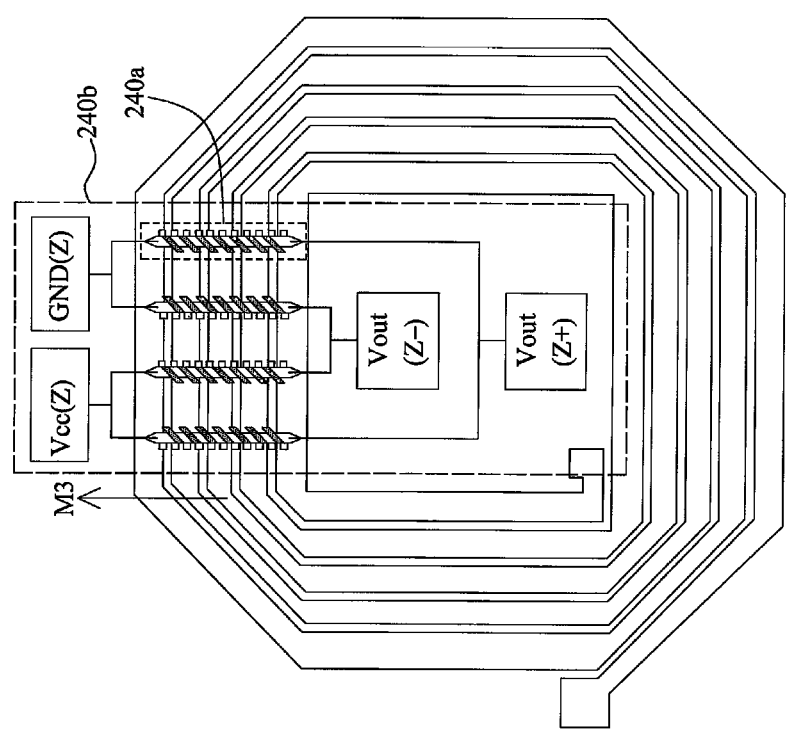
FIG. 2B schematically illustrates the third magnetoresistive element of a single-chip three-axis magnetic field sensing device with a coil according to another embodiment of the present invention.
Figure 2C:
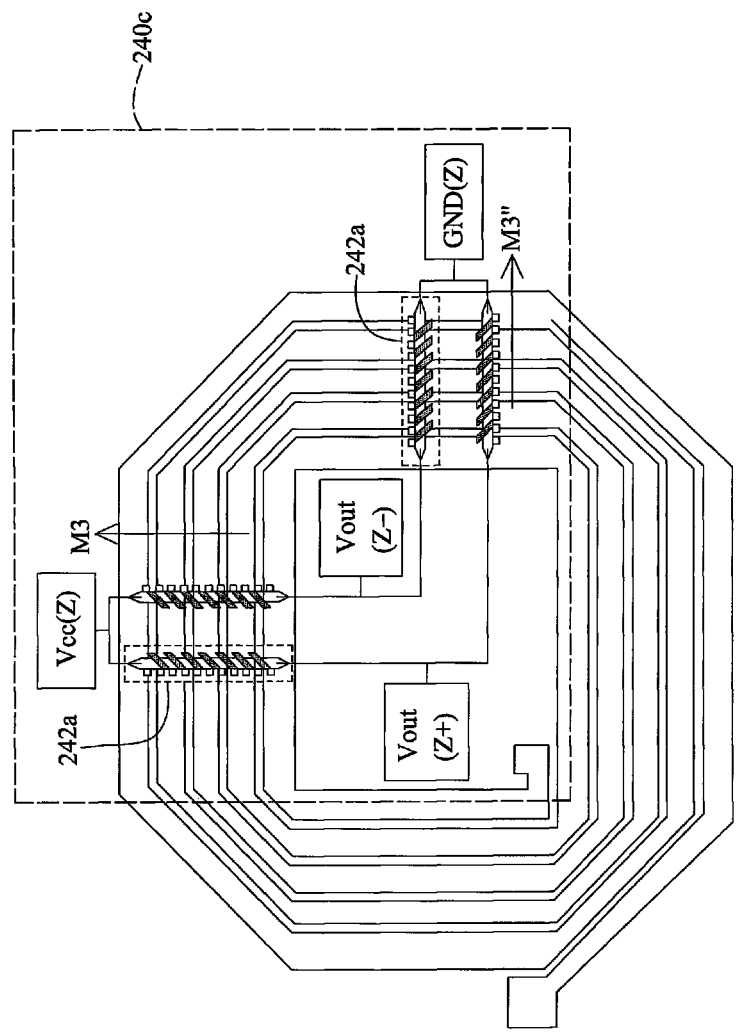
FIG. 2C schematically illustrates the third magnetoresistive element of a single-chip three-axis magnetic field sensing device with a coil according to yet another embodiment of the present invention.

In FIG. 2B, the third sensing module 240b for example may comprise four third magnetoresistive elements 242a that share the same magnetization direction, the third magnetization direction M3. In FIG. 2C, the third sensing module 240c for example may comprise two sets of third magnetoresistive elements 242a. One set of third magnetoresistive elements 242a have the third magnetization direction M3 while the other set of third magnetoresistive elements 242a have the third magnetization direction M3" substantially perpendicular to the third magnetization direction M3. However, the relative position of the third sensing module to the coil of the present invention is not limited thereto.

Figure 2D:
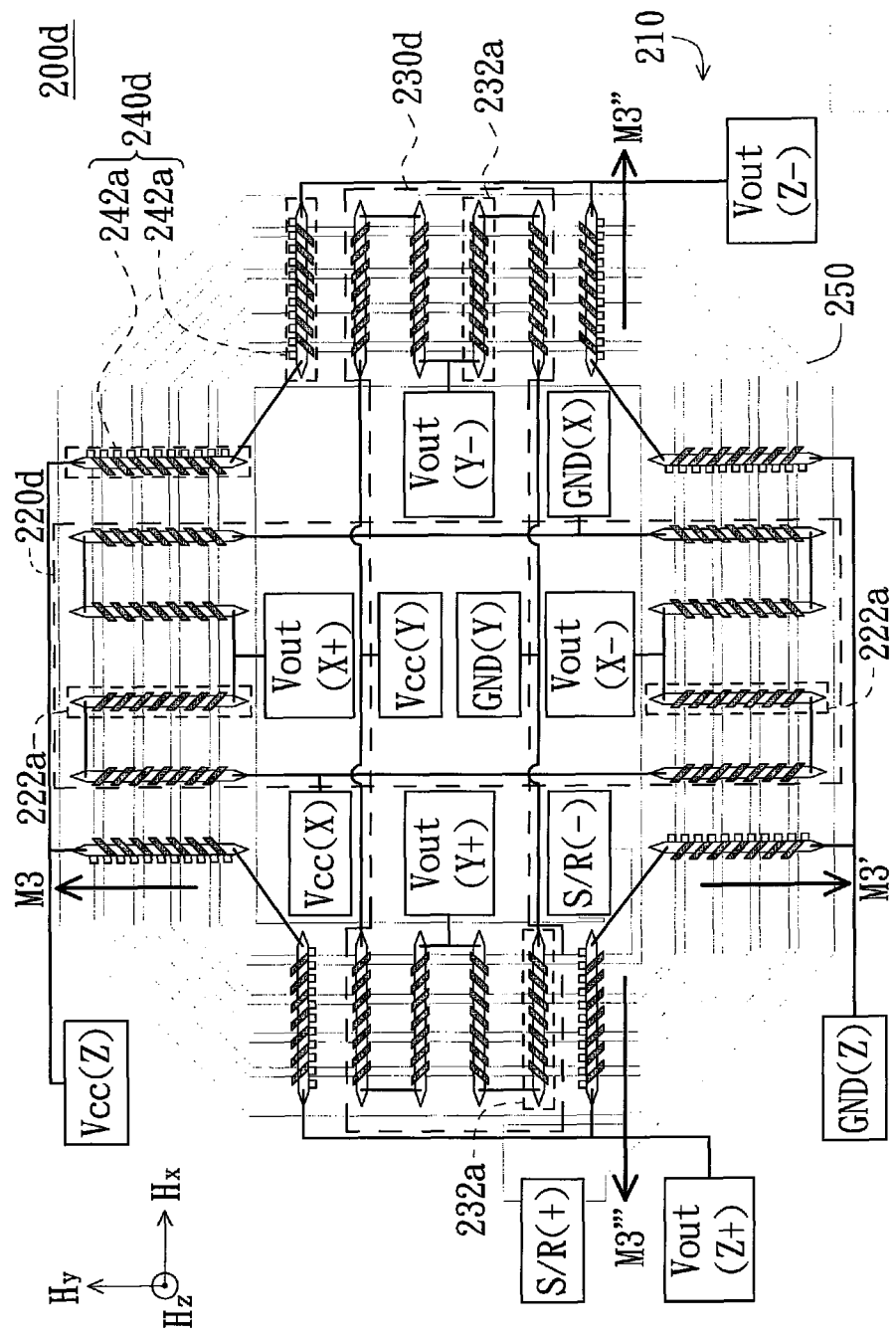
FIG. 2D schematically illustrates the structure of a single-chip three-axis magnetic field sensing device with a coil according to another embodiment of the present invention.

FIG. 2D schematically illustrates the structure of a single-chip three-axis magnetic field sensing device with a coil according to another embodiment of the present invention. Similarly, please refer to FIG. 2D, the single-chip three-axis magnetic field sensing device 200d comprises a substrate 210, at least one coil 250, a first sensing module 220d, a second sensing module 230d and a third sensing module 240d. The coil 250 is disposed above the substrate 210 and substantially parallel to a surface of the substrate 210. The first sensing module 220d, the second sensing module 230d and the third sensing module 240d are all disposed right above the coil 250. In this embodiment, the first sensing module 220d and a portion of the third sensing module 240d are juxtaposed; the second sensing module 230d and the other portion of the third sensing module 240d are juxtaposed. The first sensing module 220d comprises a wheatstone bridge circuit substantially composed of eight first magnetoresistive elements 222a; the second sensing module 230d comprises a wheatstone bridge circuit substantially composed of eight second magnetoresistive elements 232a; the third sensing module 240d comprises a wheatstone bridge circuit substantially composed of eight third magnetoresistive elements 242a. For the eight third magnetoresistive elements 242a, there are four sets of the third magnetoresistive elements 242a and each set has two third magnetoresistive elements 242a sharing the same magnetization direction. Therefore, there are four different magnetization directions for these eight third magnetoresistive elements 242a: the third magnetization direction M3, the third magnetization direction M3', the third magnetization direction M3" and the third magnetization direction M3'''. The third magnetization direction M3 forms an angle of 90 degree with respect to the third magnetization direction M3"; the third magnetization direction M3 forms an angle of 180 degree with respect to the third magnetization direction M3'; and the third magnetization direction M3' forms an angle of 90 degree with respect to the third magnetization direction M3". In this embodiment, the third sensing module 240d not only comprises the third magnetoresistive element with a length direction along the Y-direction but also comprises the third magnetoresistive element with a length direction along the X-direction, so it is more balanced and more sensitive. However, the relative position of the third sensing module to the coil is not limited thereto.

Figure 2E:
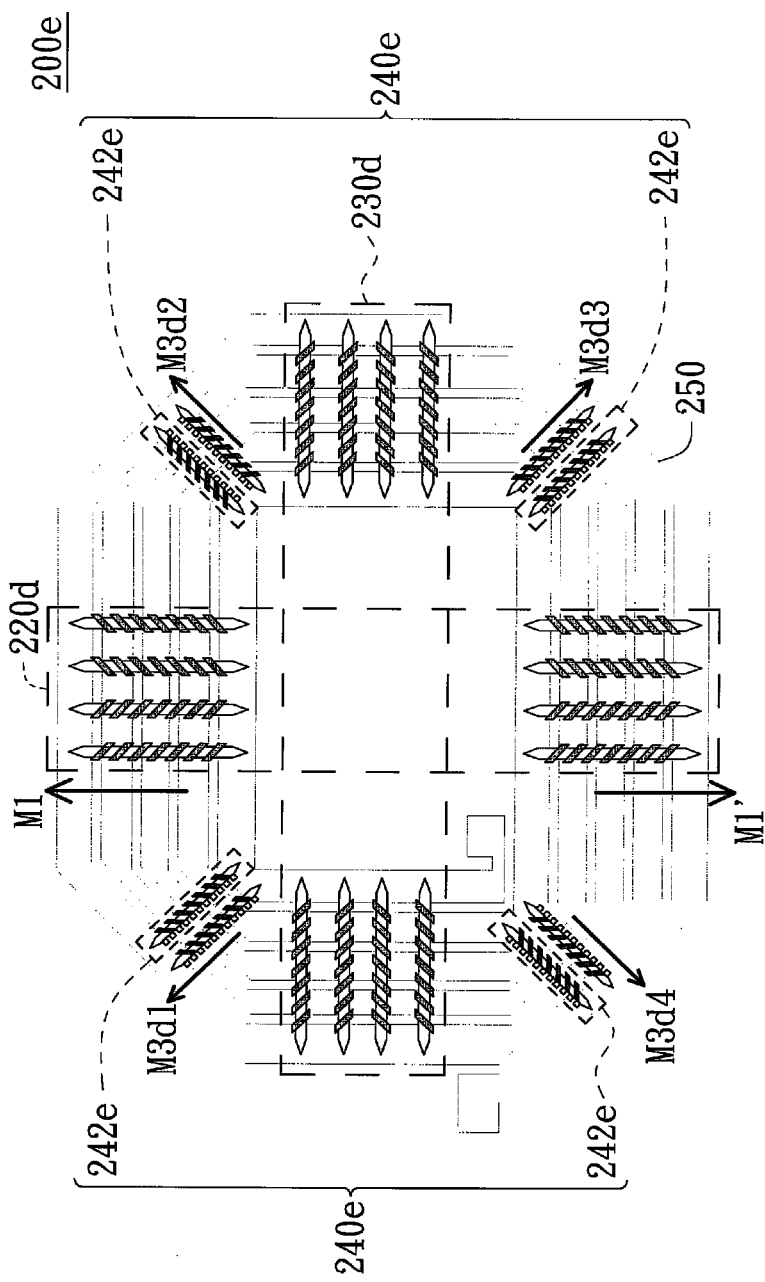
FIG. 2E schematically illustrates the structure of a single-chip three-axis magnetic field sensing device with a coil according to still another embodiment of the present invention.

FIG. 2E schematically illustrates the structure of a single-chip three-axis magnetic field sensing device with a coil according to still another embodiment of the present invention. In order to emphasize the relative positions of each third magnetoresistive element of the third sensing module, the electrical connections between the first, second and third sensing modules are omitted from FIG. 2E. Please refer to FIG. 2E, the single-chip three-axis magnetic field sensing device 200e shown in FIG. 2E is similar to the single-chip three-axis magnetic field sensing device 200d shown in FIG. 2D. Their difference lies on the relative position of the third sensing module to the coil 250. The third sensing module 240e also comprises a wheatstone bridge circuit composed of eight third magnetoresistive elements 242e. For the eight third magnetoresistive elements 242e, there are four sets of the third magnetoresistive elements 242e and each set has two third magnetoresistive elements 242e sharing the same magnetization direction. Therefore, there are four different magnetization directions for these eight third magnetoresistive elements 242e: the third magnetization direction M3d1, the third magnetization direction M3d2, the third magnetization direction M3d3 and the third magnetization direction M3d4. These four third magnetization directions all substantially perpendicular to the spiral path of the coil 250. Furthermore, the third magnetization direction M3d1 and the third magnetization direction M3d2 for example form an angle of 45 degree with respective to the first magnetization direction M1 respectively; the third magnetization direction M3d3 and the third magnetization direction M3d4 for example form an angle of 45 degree with respect to the first magnetization direction M1' respectively. The third magnetization direction M3d1 forms an angle of 90 degree with respect to the third magnetization direction M3d2; the third magnetization direction M3d1 forms an angle of 180 degree with respect to the third magnetization direction M3d3; the third magnetization direction M3d2 forms an angle of 180 degree with respect to the third magnetization direction M3d4. However, the relative position of the third sensing module to the coil is not limited thereto.

Figure 2F:
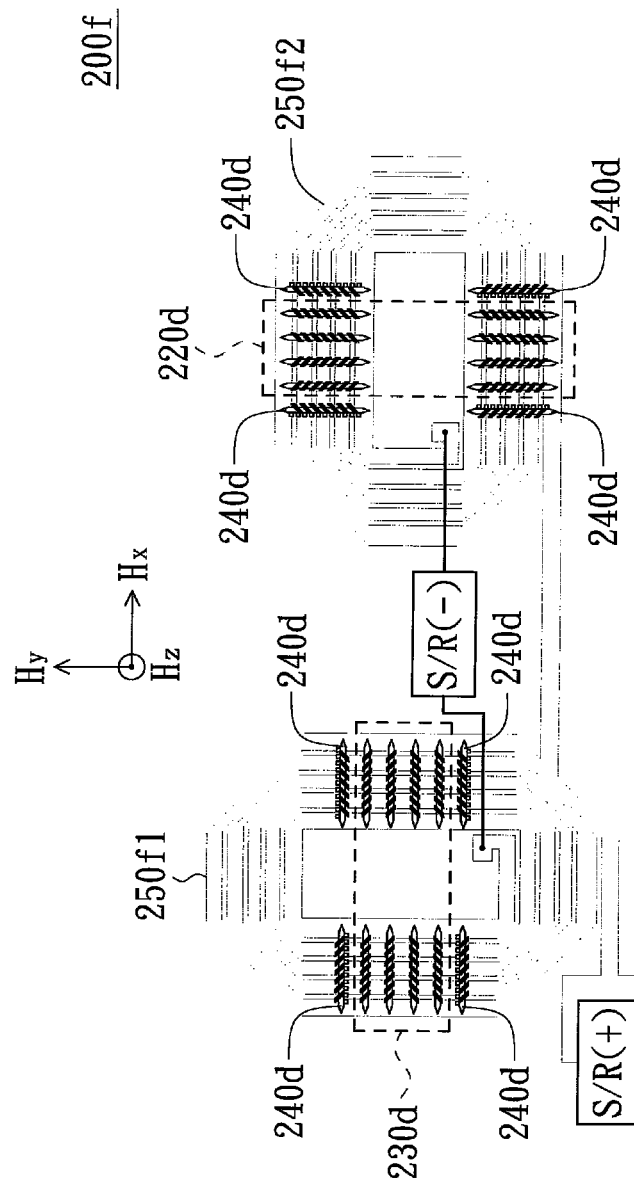
FIG. 2F schematically illustrates the structure of a single-chip three-axis magnetic field sensing device with two coils connected in parallel according to still another embodiment of the present invention.

It is worth mentioning that the single-chip three-axis magnetic field sensing device of the present invention may comprise coils connected in serial, coils connected in parallel, multiple independent coils or a combination thereof. In order to emphasize coil arrangement and the relative positions of all the sensing modules to the coil, electrical connections between the first, second and third sensing modules are omitted from FIG. 2F. FIG. 2F shows two coils connected in parallel. In this embodiment, two of the first sensing module, second sensing module and third sensing module would share the same coil. With this idea in mind, the present invention provides a single-chip three-axis magnetic field sensing device 200f with two coils 250f1 and 250f2 connected in parallel. In the single-chip three-axis magnetic field sensing device 200f, for example, the second sensing module 230d and a portion of the third sensing module 240d are disposed right above or below the coil 250f1 and the first sensing module 220d and the other portion of the third sensing module 240d are disposed right above or below the coil 250f2. The coil 250f1 and the coil 250/2 are electrically connected in parallel. However, the connection between coils of the present invention is not limited thereto.

Although processes for manufacturing the coils, first magnetoresistive elements, second magnetoresistive elements and third magnetoresistive elements are not mentioned here, it is noted that one or more dielectric layers may be disposed above, below and/or between these structures in order to electrically insulate these structures and one or more metal interconnect layers may be used to electrically connect these structures in a desired way. Moreover, the coil may be formed from one of the interconnect layers and its material could be the same with or different from the material of the conductive structure 2433a which may comprise Cu, Al, W, Ti, TiN, Ta, TiN, Mn or a combination thereof. Furthermore, in order to simplify the manufacturing processes and reduce the cost, the horizontal magnetic structures 2431a of the first magnetoresistive elements, the second magnetoresistive elements and the third magnetoresistive elements may be the same layer of a same material and the conductive structures of the the first magnetoresistive elements, the second magnetoresistive elements and the third magnetoresistive elements may also be another same layer of a same material. That is, during the manufacturing processes, the horizontal magnetic structures 2431a of the first magnetoresistive elements, the second magnetoresistive elements and the third magnetoresistive elements are formed by same depositing, lithography and etching processes and the conductive structures of the first magnetoresistive elements, the second magnetoresistive elements and the third magnetoresistive elements are formed by same depositing, lithography and etching processes.

Figure 3A:
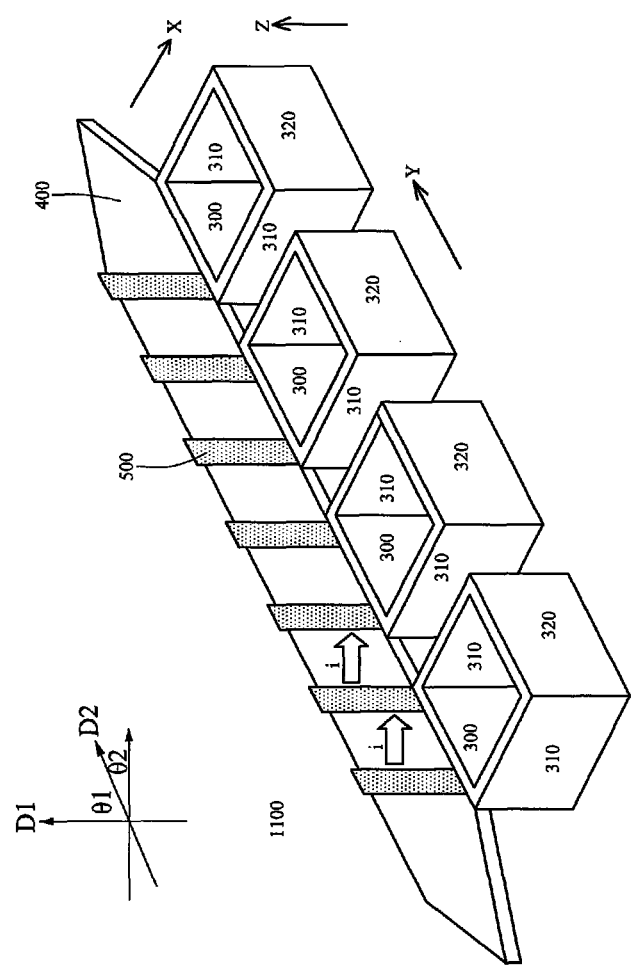
FIGS. 3A-3C schematically illustrate various third magnetoresistive elements of single-chip three-axis magnetic field sensing devices according to different embodiments of the present invention.
Figure 3B:
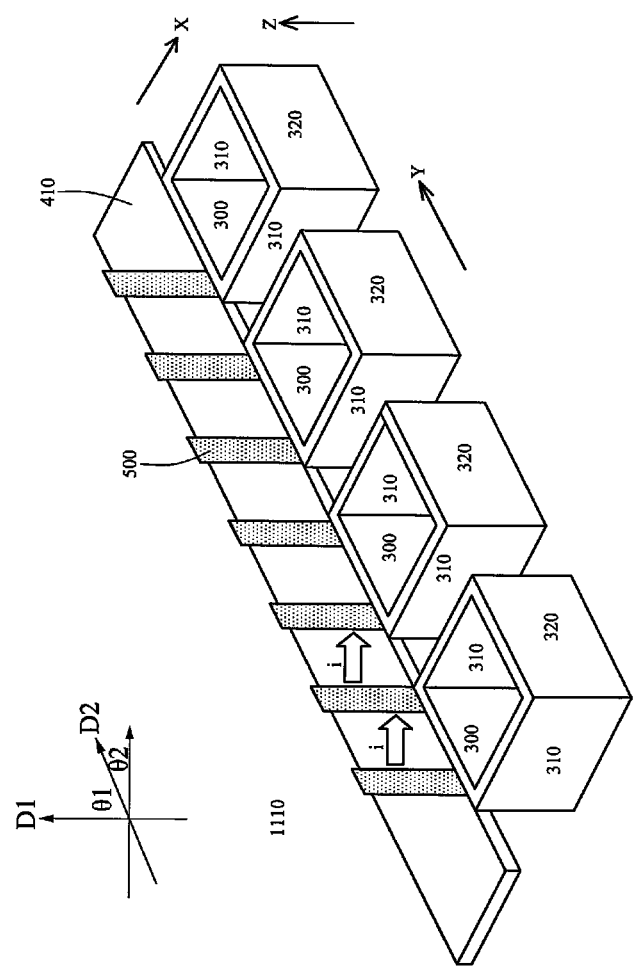
Figure 3C:
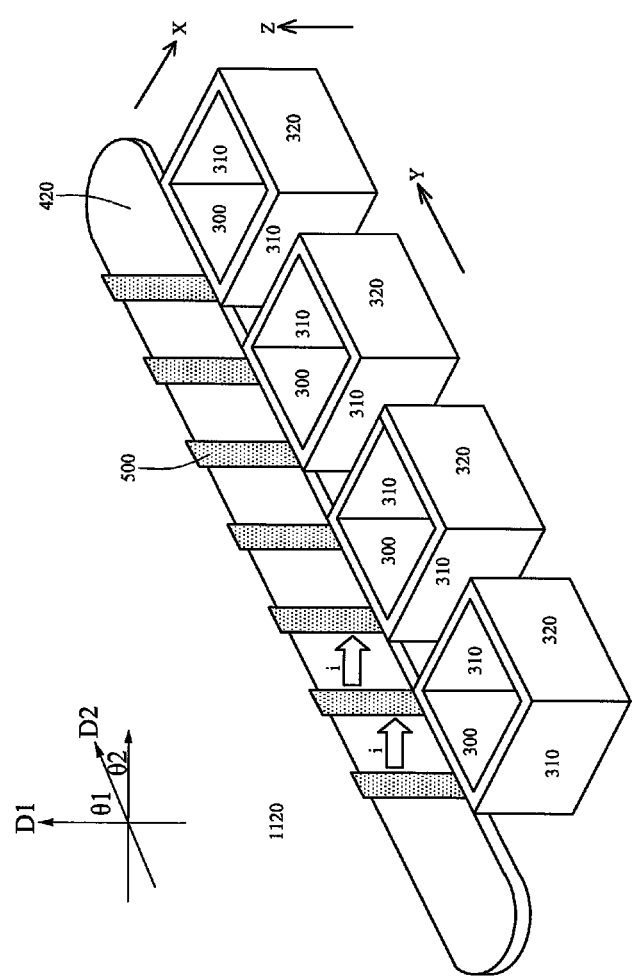

FIG. 3A illustrates the structure of a third magnetoresistive element 1100 according to another embodiment of the present invention. The third magnetoresistive element 1100 (corresponding to the third magnetoresistive element 242a in FIG. 2A) primarily comprises a horizontal magnetoresistive layer 400 (corresponding to the horizontal magnetic structure 2431a in FIG. 2A), a magnetic-field-sensing layer 300 (corresponding to the magnetic field direction adjusting unit 245a in FIG. 2A) not parallel to the surface of the substrate and a conductive part 500 (corresponding to the conductive structure 2433a in FIG. 2A). The strip of horizontal magnetoresistive layer 400 is disposed above the surface of the substrate 210 and substantially parallel thereto. It has the shape of a long, narrow plate with pointed ends. However, the ends may be flat (as shown in FIG. 3B) or rounded (as shown in FIG. 3C). In this embodiment, the length direction of the horizontal magnetoresistive layer 400 (corresponding to the length direction D2 in FIG. 2A) extends along the direction of Y (hereafter it is referred to as Y-direction). It is noted that this embodiment shows only one of many third magnetoresistive elements so the horizontal magnetoresistive layers 400 (corresponding to the horizontal magnetic structure 2431a in FIG. 2A) of other third magnetoresistive elements may have different orientations. In this embodiment, The horizontal magnetoresistive layer 400 along its length direction (Y direction) has two long sides, a first side close to the direction of +X (hereafter it is referred to as +X-direction) and a second side close to the direction of −X (hereafter it is referred to as −X-direction). The magnetic-field-sensing layer 300 is also disposed above the surface of the substrate 210 and substantially parallel thereto. Even though in FIG. 3A the magnetic-field-sensing layer 300 for example is of vertical orientation, the present invention is not limited thereto. It can be designed to be a slant or a combination of multiple slants as long as it's not parallel to the substrate surface. The magnetic-field-sensing layer 300 extends downwards or upwards from the first side or second side of the horizontal magnetoresistive layer 400 (in FIG. 3A, downwards from the first side) and magnetically coupled thereto, so as to redirect/guide the Z-axis magnetic field felt by it to the horizontal magnetoresistive layer 400. This would cause a change of the resistance of the Z-axis magnetoresistive sensing element 1100, resulting in a change of the output voltage. The horizontal magnetoresistive layer 400 and the magnetic-field-sensing layer 300 may be formed from the same magnetoresistive material in one structure, or may be formed from the same or different magnetoresistive materials separately into physically connected separate structures, or may be formed from the same or different magnetoresistive materials separately into physically separated discrete structures. When same material is used, different thicknesses can be adopted according to design requirements. The horizontal magnetoresistive layer 400 and the magnetic-field-sensing layer 300 can be physically separated as long as they are close enough to magnetically affect each other. In this embodiment, the magnetic-field-sensing layer 300 comprises multiple discrete sub-portions and each sub-portion takes a form of a portion of a magnetoresistive layer on the sidewall of a downward trench, so there are multiple downward trenches accommodate the multiple discrete sub-portions of the magnetic-field-sensing layer 300 respectively. The rest of the magnetoresistive layer on the sidewall of each downward trench comprises two connecting magnetoresistive layers 310 physically connected to the magnetic-field-sensing layer 300 and an opposite magnetoresistive layer 320 physically connected to the two connecting magnetoresistive layers 310. Nonetheless, the connecting magnetoresistive layers 310 and the opposite magnetoresistive layer 320 do not contribute to Z-axis magnetic field sensing, they are not discussed further. Preferably, each downward trench has the same size, depth, sidewall slope, so each discrete sub-portion of the magnetic-field-sensing layer 300 has approximately the same area and thickness. Preferably, the distances between the adjacent downward trenches are the same.

The conductive part 500 (corresponding to the conductive structure 2433a in FIG. 2A) is disposed above or below the horizontal magnetoresistive layer 400 (corresponding to the horizontal magnetic structure 2431a in FIG. 2A) to electrically or preferably physically contact the horizontal magnetoresistive layer 400. The length direction D1 of the conductive part 500 is not parallel to the length direction D2 of the horizontal magnetoresistive layer 400. Therefore, the conductive part 500 serves as a shunt to change a direction of the current i flowing in the horizontal magnetoresistive layer 400 (thereafter "direction of the current" is referred to "current direction"), so the current direction in the horizontal magnetoresistive layer 400 forms an angle $\theta 2$ with respect to a direction of the magnetization of horizontal magnetoresistive layer 400 (in FIG. 2A, magnetization direction is substantially parallel to the length direction D2 of the horizontal magnetoresistive layer 400), thereby increasing sensitivity of the Z-axis magnetoresistive sensing element 1100. In this embodiment, multiple conductive parts 500 have the same width, have the same distance between the adjacent ones, and all form an acute angle $\theta 1$ with respect to the length direction D2 of the horizontal magnetoresistive layer 400. Preferably, the length direction D1 of the conductive parts 500 forms 45 degree angle with respect to the length direction D2 of the horizontal magnetoresistive layer 400. Since the conductive part 500 adopts one or more conductive metals as its material, its resistivity is far smaller than the resistivity of the magnetoresistive material adopted by the horizontal magnetoresistive layer 400. Hence, in the area where the conductive part 500 is in physical contact with the horizontal magnetoresistive layer 400, electrical current would take the conductive part 500 with smaller resistivity as its conducting path; within the horizontal magnetoresistive layer 400 (that is the area between adjacent conductive parts 500), electrical current i would take the shortest distance between the adjacent conductive parts 500 as its conducting path. The horizontal magnetoresistive layer 400 and the conductive part 500 together form a conducting path: the horizontal magnetoresistive layer 400→the conductive part 500→the horizontal magnetoresistive layer 400 between adjacent conductive parts 500→the next conductive part 500 . . . . Since multiple conductive parts 500 have the same shape, the same width, the same orientation and have the same distance between the adjacent ones, the electrical currents i between the adjacent conductive parts 500 flow along the same direction and this conducting direction forms an angle θ2 with respect to the length direction D2 of the horizontal magnetoresistive layer 400. In this embodiment, θ1 and θ2 together are 90 degrees.

Please refer to FIGS. 3B and 3C for the third magnetoresistive element 1110 and 1120 of other embodiments of the present invention. In terms of basic structures, the third magnetoresistive elements 1110 and 1120 shown in FIGS. 3B and 3C respectively are similar to the third magnetoresistive element 1100 shown in FIG. 3A. The difference lies on the shapes of the ends of the horizontal magnetoresistive layers 400. The horizontal magnetoresistive layers 400 of the third magnetoresistive elements 1110 and 1120 shown in FIGS. 3B and 3C respectively have flat and rounded ends, but the horizontal magnetoresistive layer 400 of the third magnetoresistive element 1110 shown in 3A has pointed ends. It is worth noting that the combination of the horizontal magnetoresistive layer 400 and the conductive parts 500 shown in FIGS. 3A, 3B and 3C respectively may also be applied to the first magnetoresistive element 222a and the second magnetoresistive element 232a shown in FIGS. 2A-2F. In order to achieve the functional operation of a wheatstone bridge circuit, according to different locations with respect to the coil, the orientations of the magnetic-field-sensing layer 300 can be properly adjusted (at the first side or second side) and/or the orientations of the conductive parts 500 can be properly adjusted (left up right down or left down right up).

Figure 4:
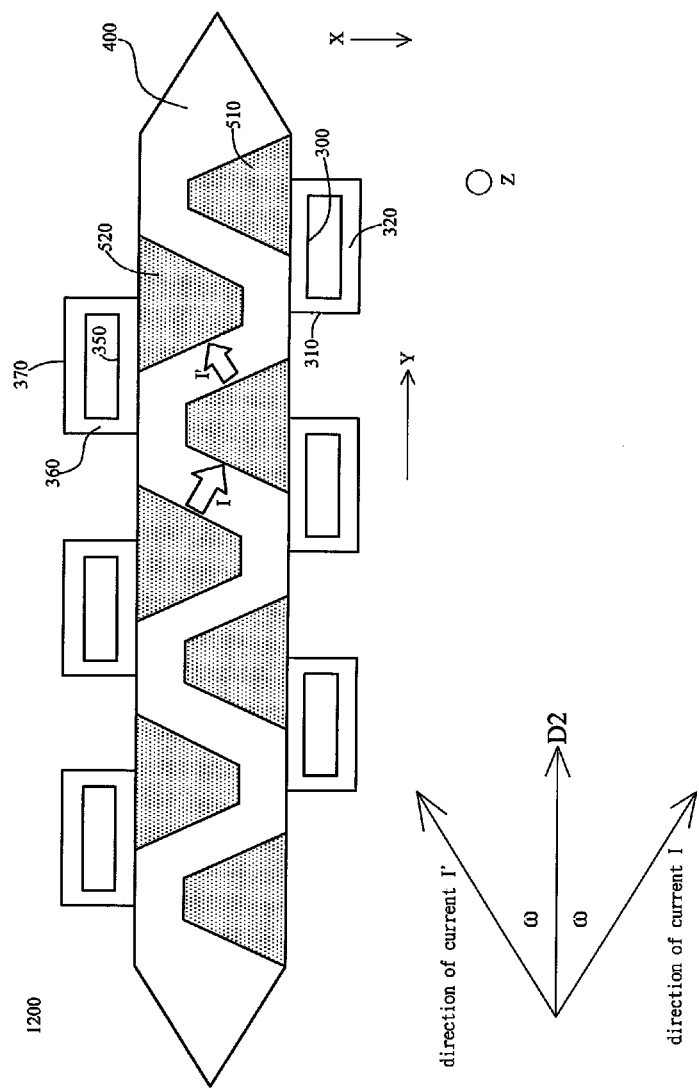
FIGS. 4-7 schematically illustrate other kinds of third magnetoresistive elements of single-chip three-axis magnetic field sensing devices according to different embodiments of the present invention

Now refer to FIG. 4 for the top view of the third magnetoresistive element 1200 according to another embodiment of the present invention. The third magnetoresistive element 1200 (corresponding to the third magnetoresistive element 242a in FIG. 2A) primarily comprises a horizontal magnetoresistive layer 400 (corresponding to the horizontal magnetic structure 2431a shown in FIG. 2A), a magnetic-field-sensing layer 300 of the first side not parallel to the substrate (hereafter referred to as magnetic-field-sensing layer 300, corresponding to the magnetic field direction adjusting unit 245a shown in FIG. 2A), a magnetic-field-sensing layer 350 of the second side not parallel to the substrate (hereafter referred to as magnetic-field-sensing layer 350, no corresponding component in FIG. 2A), multiple conductive parts of the first side 510 and multiple conductive parts of the second side 520 (510 and 520 together corresponding to the conductive structure 2433a in FIG. 2A in terms of function). The horizontal magnetoresistive layer 400 of this embodiment is the same as the one shown in FIG. 3A in their shape, material and orientation, so its descriptions are omitted to save repetitions.

The magnetic-field-sensing layer 300 of the first side in this embodiment is similar to the magnetic-field-sensing layer 300 shown in FIG. 3A. It is substantially perpendicular to the substrate surface, extends downwards or upwards from the first side of the horizontal magnetoresistive layer 400 (downwards in FIG. 4) and is magnetically coupled to the horizontal magnetoresistive layer 400. The magnetic-field-sensing layer 300 of the first side comprises multiple discrete sub-portions and each sub-portion takes a form of a portion of a magnetoresistive layer on the sidewall of a downward trench, so there are multiple downward trenches accommodate the multiple discrete sub-portions of the magnetic-field-sensing layer 300 respectively. Similarly, the rest of the magnetoresistive layer on the sidewall of each downward trench comprises two connecting magnetoresistive layers 310 physically connected to the magnetic-field-sensing layer 300 and an opposite magnetoresistive layer 320 physically connected to the two connecting magnetoresistive layers 310. In this embodiment, the third magnetoresistive element 1200 further comprises the magnetic-field-sensing layer 350 not parallel to the substrate surface. Similar to the magnetic-field-sensing layer 300, the magnetic-field-sensing layer 350 is substantially perpendicular to the substrate surface, extends downwards or upwards from the second side of the horizontal magnetoresistive layer 400 (downwards in FIG. 4) and is magnetically coupled to the horizontal magnetoresistive layer 400. The magnetic-field-sensing layer 350 of the second side comprises multiple discrete sub-portions and each sub-portion takes a form of a portion of a magnetoresistive layer on the sidewall of a downward trench. Similarly, the rest of the magnetoresistive layer on the sidewall of each downward trench comprises two connecting magnetoresistive layers 360 physically connected to the magnetic-field-sensing layer 350 and an opposite magnetoresistive layer 370 physically connected to the two connecting magnetoresistive layers 360.

In comparison with FIG. 3A, in FIG. 4 the distance between adjacent sub-portions of the magnetic-field-sensing layer 300 is farther and the distance between adjacent sub-portions of the magnetic-field-sensing layer 350 is also farther; the sub-portions of the magnetic-field-sensing layer 300 and the sub-portions of the magnetic-field-sensing layer 350 are disposed alternatively along the length direction D2 of the horizontal magnetoresistive layer 400 (Y-direction); the sub-portions of the magnetic-field-sensing layer 300 and the sub-portions of the magnetic-field-sensing layer 350 may partially overlap with each other or not overlap at all. Preferably, each downward trench of the first side and second side may have the same size, depth, sidewall slope, so each discrete sub-portion of the magnetic-field-sensing layer 300/350 has approximately the same area and thickness. Preferably, the distances between the adjacent downward trenches are the same. Preferably, the distances between the adjacent downward trenches of the first/second side are the same.

The multiple conductive parts 510 of the first side extend from the first side of the horizontal magnetoresistive layer 400 toward the second side preferably reaching the second side; the multiple conductive parts 520 of the second side extend from the second side of the horizontal magnetoresistive layer 400 toward the first side preferably reaching the first side. The multiple conductive parts 510 of the first side and the multiple conductive parts 520 of the second side may have the same shape or different shapes (same in this embodiment) and may take any shapes (trapezoid in this embodiment). In general, the multiple conductive parts 510 of the first side usually have the same shape, size and distance between the adjacent ones, the multiple conductive parts 520 of the second side usually have the same shape, size and distance between the adjacent ones, and the multiple conductive parts 510 of the first side and the multiple conductive parts 520 of the second side are disposed alternatively along the length direction D2 of the horizontal magnetoresistive layer 400 (Y-direction). Preferably, the multiple conductive parts 510 of the first side and the multiple conductive parts 520 of the second side have the same shape and size and the adjacent sides of a conductive part 510 of the first side and the adjacent conductive part 520 of the second side are substantially parallel (one leg of a conductive part 510 of the first side is substantially parallel to one leg of the adjacent conductive part 520 of the second side in this embodiment). Since a conductive part 510 of the first side and the adjacent conductive part 520 of the second side adopt one or more conductive metals as their materials, their resistivity is far smaller than the resistivity of the magnetoresistive material adopted by the horizontal magnetoresistive layer 400. Hence, in the area where the conductive part 510/520 is in physical contact with the horizontal magnetoresistive layer 400, electrical current would take the conductive part 510/520 with smaller resistivity as its conducting path; within the horizontal magnetoresistive layer 400 (that is the area between adjacent conductive part 510 and conductive part 520), electrical current I/I' would take the shortest distance between the adjacent conductive part 510 and conductive part 520 as its conducting path. When within the horizontal magnetoresistive layer 400 electrical current flows from a conductive part 520 to the adjacent conductive part 510, current I forms an angle +ω with respect to the length direction D2 of the horizontal magnetoresistive layer 400 (Y-direction). When within the horizontal magnetoresistive layer 400 electrical current flows from a conductive part 510 to the adjacent conductive part 520, current I' forms an angle −ω with respect to the length direction of the horizontal magnetoresistive layer 400 (Y-direction). ω represents the same number and its magnitude depends on a slope of the leg of the trapezoid. +ω represents an angle deviating from the length direction along clockwise direction and −ω represents an angle deviating from the length direction along counterclockwise direction. The horizontal magnetoresistive layer 400 and the conductive part 510/520 together form a conducting path: the horizontal magnetoresistive layer 400→the conductive part 510→the horizontal magnetoresistive layer 400 between adjacent conductive part 510 and conductive part 520→the conductive part 520→the horizontal magnetoresistive layer 400 between adjacent conductive part 520 and conductive part 510 . . . .

All the sub-portions of the magnetic-field-sensing layer 300 and multiple conductive parts 510 extend from the first side of the horizontal magnetoresistive layer 400. Except rare situations where the length of the horizontal magnetoresistive layer 400 would not allow, each sub-portion of the magnetic-field-sensing layer 300 corresponds to a conductive part 510 of the first side and they partially overlap at the first side. The length of overlap is preferable half length of a sub-portion of the magnetic-field-sensing layer 300 and/or half length of a base side of the conductive part 510 (half length of a base side of a trapezoid in this embodiment). Same principle can be applied to the sub-portions of the magnetic-field-sensing layer 350 and multiple conductive parts 520 extending from the second side of the horizontal magnetoresistive layer 400 (their corresponding relationship and overlap at the second side).

Figure 5:
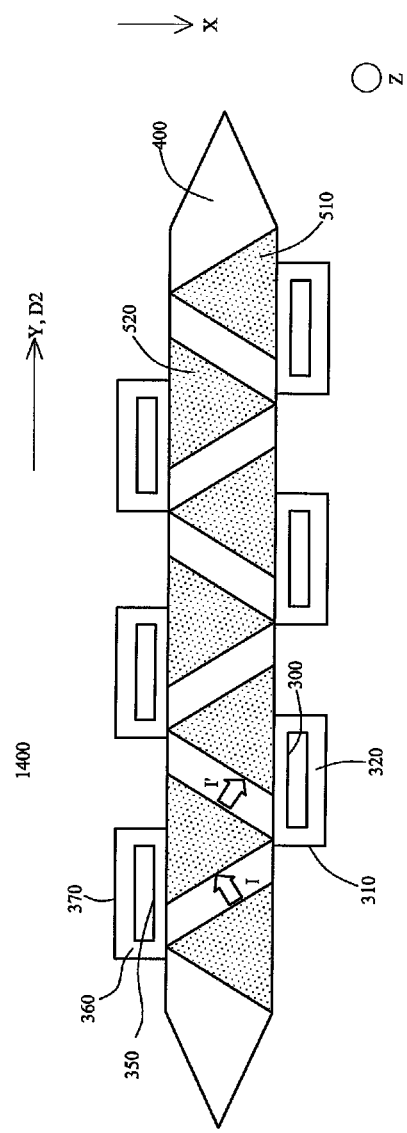
Figure 6:
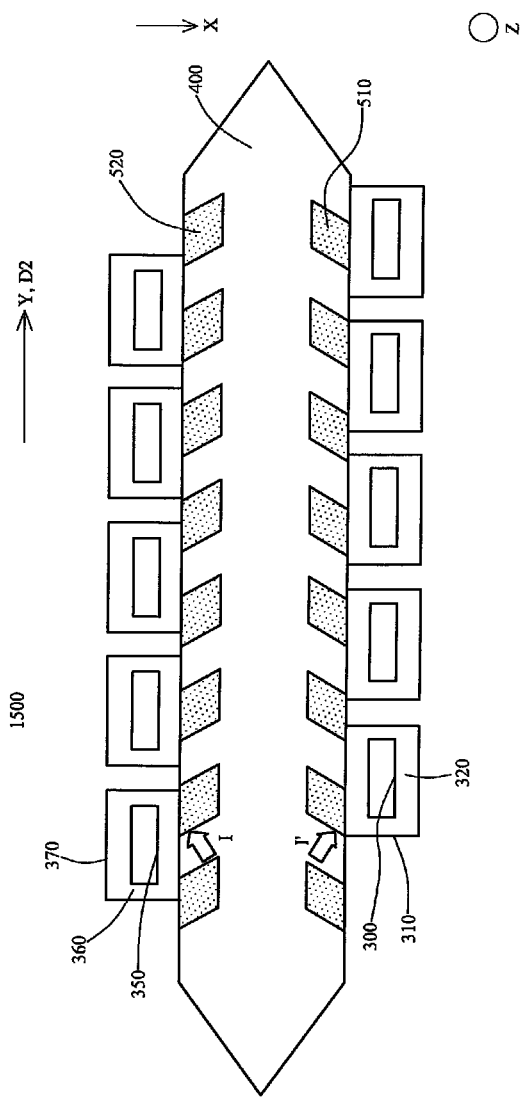
Figure 7:
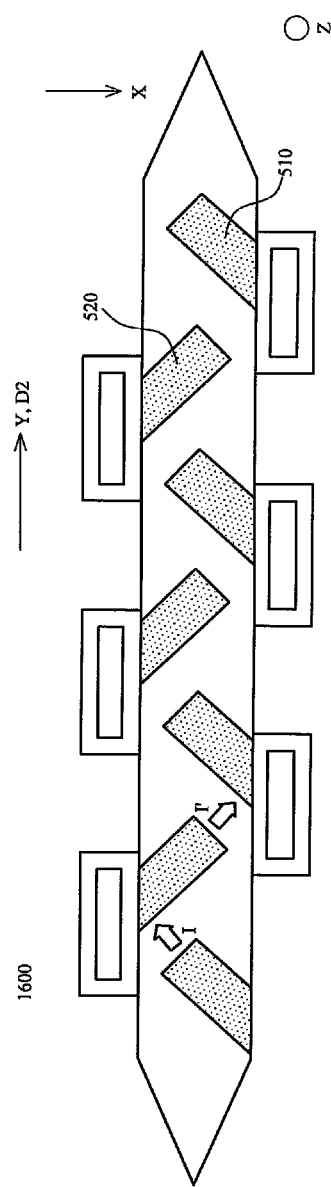

Now refer to FIGS. 5-7 for top views of the third magnetoresistive element according to other embodiments of the present invention. After detailed explanations for the third magnetoresistive element 1200 of FIG. 4 are provided, a person of ordinary skills in the art should understand that the explanations for FIG. 4 can be foundations to embodiments of FIGS. 5-7, so repetitions are omitted here. The difference between the third magnetoresistive element 1400 of FIG. 5 and the third magnetoresistive element 1200 is: the conductive part 510 of the first side and the conductive part 520 of the second side of FIG. 4 are trapezoid-shaped and they all extend from one side of the horizontal magnetoresistive layer 400 toward the other side of the horizontal magnetoresistive layer 400 without reaching the other side while the conductive part 510 of the first side and the conductive part 520 of the second side of FIG. 5 take isosceles triangle or equilateral triangle as their shape (depends on width of the horizontal magnetoresistive layer 400) and they all extend from one side of the horizontal magnetoresistive layer 400 toward the other side of the horizontal magnetoresistive layer 400 reaching the other side. Since the arrangement of the horizontal magnetoresistive layer 400, the magnetic-field-sensing layer 300 of the first side and the magnetic-field-sensing layer 350 of the second side are the same as the one of FIG. 4, they are not repeated again.

There are several differences between the third magnetoresistive element 1500 of FIG. 6 and the third magnetoresistive element 1200. First, the multiple downward trenches of the first side and the multiple downward trenches of the second side of FIG. 4 are spread out more than the ones of FIG. 6, thereby distance between the adjacent sub-portions of the magnetic-field-sensing layer 300 and distance between the adjacent sub-portions of the magnetic-field-sensing layer 350 of FIG. 4 are farther than the ones of FIG. 6. So the magnetic-field-sensing layer 300 and magnetic-field-sensing layer 350 of FIG. 6 are disposed alternatively along the length direction of the horizontal magnetoresistive layer 400 but they overlap more than the ones of FIG. 4. Second, the conductive part 510 of the first side and the conductive part 520 of the second side of FIG. 4 are trapezoid-shaped, they all extend from one side of the horizontal magnetoresistive layer 400 toward the other side of the horizontal magnetoresistive layer 400 passing the half width of the horizontal magnetoresistive layer 400 and they are disposed alternatively along the length direction of the horizontal magnetoresistive layer 400. The conductive part 510 of the first side and the conductive part 520 of the second side of FIG. 6 are parallelogram-shaped, they all extend from one side of the horizontal magnetoresistive layer 400 toward the other side of the horizontal magnetoresistive layer 400 without passing the half width of the horizontal magnetoresistive layer 400 and they are disposed symmetrically along the length direction of the horizontal magnetoresistive layer 400.

Due to the differences addressed in the previous paragraph, when the third magnetoresistive element 1500 operates, the electrical current does not flow from the conductive part 510 of the first side to the conductive part 520 of the second side or from the conductive part 520 of the second side to the conductive part 510 of the first side. Because the conductive part 510 of the first side and the conductive part 520 of the second side have farther distance between them and the high resistivity of the magnetoresistive material between them, the conducting path become the following route: in an area where the conductive part 510 is in physically contact with the horizontal magnetoresistive layer 400, electrical current would take the conductive part 510 with smaller resistivity as its conducting path while within the horizontal magnetoresistive layer 400 (that is, between the adjacent conductive parts 510) electrical current I' would take the shortest distance between the adjacent conductive parts 510 as its conducting path. The horizontal magnetoresistive layer 400 and the conductive parts 510 together form at least one electrical path (horizontal magnetoresistive layer 400□conductive part 510□horizontal magnetoresistive layer 400 between the adjacent conductive parts 510 the next conductive part 510 (the next conductive part . . . ). Similarly, within the horizontal magnetoresistive layer 400 (that is, between the adjacent conductive parts 520), electrical current I would take the shortest distance between the adjacent conductive parts 520 as its conducting path. The horizontal magnetoresistive layer 400 and the conductive parts 520 together form at least one electrical path (horizontal magnetoresistive layer 400 (conductive part 520 (horizontal magnetoresistive layer 400 between the adjacent conductive parts 520 (the next conductive part 520 . . . ). When the conductive part 510 and the conductive part 520 have the same shape, size and distance between the adjacent ones, an angle between a first conducting direction of current I' and the length direction of the horizontal magnetoresistive layer 400 is equivalent to an angle between a second conducting direction of current I and the length direction of the horizontal magnetoresistive layer 400. The value of the angle depends on the slope of the parallel sides of the Parallelogram.

There are several differences between the third magnetoresistive element 1600 of FIG. 7 and the third magnetoresistive element 1200. The conductive part 510 of the first side and the conductive part 520 of the second side of FIG. 4 are trapezoid-shaped, electrical current of FIG. 4 flows from a leg of the conductive part of one side to a leg of the adjacent conductive part of the other side, and each conductive part 510/520 partially overlap with the corresponding magnetic-field-sensing layer 300/350. In FIG. 7, the conductive part 510 of the first side and the conductive part 520 of the second side have a long strip shape not parallel to the length direction D2 of the horizontal magnetoresistive layer 400, electrical current flows from the pointing end of a conductive part of one side to the base end of the next conductive part of the other side, and each conductive part 510/520 completely overlap with the corresponding magnetic-field-sensing layer 300/350. When the conductive part 510 and the conductive part 520 have the same shape, size, distance between the adjacent ones and value of tilted angle with respect to the length direction of the horizontal magnetoresistive layer 400, an angle between a first conducting direction of current I' and the length direction D2 of the horizontal magnetoresistive layer 400 is equivalent to an angle between a second conducting direction of current I and the length direction D2 of the horizontal magnetoresistive layer 400.

In the previous embodiments, since in the third magnetoresistive elements 1100, 1110 and 1120 the electrical currents i flowing between the adjacent conductive parts 500 follow an unique direction, the outputs of the third magnetoresistive elements 1100, 1110 and 1120 not only respond to an Z-axis magnetic field but also respond to an X-axis magnetic field. Therefore, a measure of designing a combination of the third magnetoresistive elements 1100, 1110 and 1120 of different orientations or a measure of adding extra circuitry must be taken for a Z-axis magnetic field sensing device in order to render the Z-axis magnetic field sensing device responsive to a Z-axis magnetic field but immune to a X-axis magnetic field.

In the third magnetoresistive elements 1200, 1400, 1500 and 1600, electrical current between the adjacent conductive parts (that is conductive part of the first side and the adjacent conductive part of the second except for 1500; for 1500, conductive part of the first side and the adjacent conductive part of the first side or conductive part of the second side and the adjacent conductive part of the second side) have two conducting directions (I and I') and said two directions are symmetrical to the length direction D2 of the horizontal magnetoresistive layer 400. Therefore, when an external magnetic field of X-direction is applied upon these third magnetoresistive elements (that is, magnetic flux points from one side of the horizontal magnetoresistive layer 400 to the other side), the effects caused by two conducting directions would counteract, thereby resulting in almost no change on the output of these third magnetoresistive elements. When an external magnetic field of Z-direction is applied upon these third magnetoresistive elements (that is two kinds of magnetic fluxes, one kind of magnetic flux points from first side of the horizontal magnetoresistive layer 400 to the second side and the other kind of magnetic flux points from the second side to the first side), the two conducting directions interact with the two kinds of magnetic fluxes, thereby resulting in a change on the output of these third magnetoresistive elements. Therefore the third magnetoresistive elements 1200, 1400, 1500 and 1600 can be used alone to achieve the result of sensing Z-axis magnetic field.

It is important to understand that any one or any combination of the third magnetoresistive elements 1100, 1110, 1120, 1200, 1400, 1500 and 1600 may be used to replace the third magnetoresistive element 242a or 242e shown in FIG. 2A-2F. Furthermore, the third magnetoresistive elements 1100, 1110 and 1120 shown in FIGS. 3A, 3B and 3C respectively only represent some examples of the third magnetoresistive elements of the present invention. In order to achieve the functional operation of a wheatstone bridge circuit, according to different locations with respect to the coil, the orientations of the magnetic-field-sensing layer 300 can be properly adjusted (at the first side or second side) and/or the orientations of the conductive parts 500 can be properly adjusted (left up right down or left down right up). To sum up, the modifications done to the horizontal magnetoresistive layers 400 in FIGS. 3B and 3C may be applied to all the third magnetoresistive elements 1200, 1400, 1500 and 1600, that is, the horizontal magnetoresistive layers 400 of the third magnetoresistive elements 1200, 1400, 1500 and 1600 may have pointed ends, flat ends or rounded ends.

In short, the present invention provides a single-chip three-axis magnetic field sensing device capable of sensing a magnetic field substantially perpendicular to a surface of substrate (Z-axis magnetic field) and capable of integrating three different sensing modules configured to sense magnetic fields of three different directions (X-axis, Y-axis and Z-axis) into the same substrate in the same manufacturing process, so it is possible to miniaturize the magnetic field sensing device. The present invention further provides a coil on the substrate configured to set and/or reset the magnetization directions of different magnetic sensing modules configured to sense magnetic fields of three different directions simultaneously. Furthermore, the coil is able to set and/or reset the magnetization directions of different magnetoresistive elements simultaneously according to their relative positions and how the coil is arranged. Therefore, the three-axis magnetic field sensing device of the present invention not only can be manufactured by simple process but also is capable of sensing magnetic fields of different directions with precisions.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A single-chip three-axis magnetic field sensing device comprising:
    a substrate including a horizontal surface along an x-y plane;
    an x-axis sensing module comprising at least one x-axis magnetoresistive element and configured to sense an x-axis magnetic field component substantially parallel to the horizontal surface;
    a y-axis sensing module comprising at least one y-axis magnetoresistive element and configured to sense a y-axis magnetic field component substantially parallel to the horizontal surface;
    a z-axis sensing module comprising at least one z-axis magnetoresistive element and configured to sense a z-axis magnetic field component substantially perpendicular to the horizontal surface; and
    a single coil,
    wherein the at least one z-axis magnetoresistive element and one of the at least one x-axis magnetoresistive element and the at least one y-axis magnetoresistive element are disposed directly above or directly below the single coil and the single coil is configured to set magnetization directions of the magnetoresistive elements directly above or directly below the single coil.

2. The single-chip three-axis magnetic field sensing device to claim 1, wherein the at least one x-axis magnetoresistive element, the at least one y-axis magnetoresistive element and the at least one z-axis magnetoresistive element are all disposed directly above or directly below the single coil.

3. The single-chip three-axis magnetic field sensing device to claim 2, wherein the at least one x-axis magnetoresistive element and the at least one z-axis magnetoresistive element are juxtaposed.

4. The single-chip three-axis magnetic field sensing device to claim 2, wherein the z-axis sensing module comprises another at least one z-axis magnetoresistive element, wherein the at least one z-axis magnetoresistive element and the at least one x-axis magnetoresistive element are juxtaposed and the another at least one z-axis magnetoresistive element and the at least one y-axis magnetoresistive element are juxtaposed.

5. The single-chip three-axis magnetic field sensing device to claim 2, wherein the at least one z-axis magnetoresistive element is disposed between the at least one x-axis magnetoresistive element and the at least one y-axis magnetoresistive element and forms a first angle and a second angle with respect to the at least one x-axis magnetoresistive element and the at least one y-axis magnetoresistive element respectively.

6. The single-chip three-axis magnetic field sensing device to claim 1, further comprising another single coil connected in parallel to the single coil, wherein the at least one x-axis magnetoresistive element and the at least one y-axis magnetoresistive element are disposed directly above or directly below the single coil and the another single coil respectively.

7. The single-chip three-axis magnetic field sensing device to claim 6, wherein the z-axis sensing module further comprises another at least one z-axis magnetoresistive element, wherein the at least one z-axis magnetoresistive element is disposed directly above or directly below the single coil and the at least one another z-axis magnetoresistive element is disposed directly above or directly below the another single coil.

8. The single-chip three-axis magnetic field sensing device to claim 1, wherein the at least one z-axis magnetoresistive element further comprises:
    a strip of horizontal magnetoresistive layer being substantially parallel to the horizontal surface;
    a conductive part disposed above or below the horizontal magnetoresistive layer and electrically coupled thereto; and
    a magnetic-field-sensing layer being not parallel to the horizontal surface and extending upward or downward from one side of the horizontal magnetoresistive layer so as to magnetically couple to the horizontal magnetoresistive layer.

9. The single-chip three-axis magnetic field sensing device to claim 8, wherein the horizontal magnetoresistive layer and the magnetic-field-sensing layer both comprises an anisotropic magnetoresistive material (AMR material) whose resistance would change along a change of an external magnetic field.

10. The single-chip three-axis magnetic field sensing device to claim 8, wherein the conductive part comprises multiple conductive strips and the magnetic-field-sensing layer comprises multiple discrete sub-portions, wherein the multiple conductive strips share the same length direction and this length direction forms an acute angle with respect to the length direction of the horizontal magnetoresistive layer.

11. The single-chip three-axis magnetic field sensing device to claim 1, wherein the x-axis sensing module, the y-axis sensing module and the z-axis sensing module comprise a x-axis, a y-axis and a z-axis wheatstone bridge circuits respectively and the x-axis wheatstone bridge circuit comprises four or a multiple of four the at least one x-axis magnetoresistive elements and the y-axis wheatstone bridge circuit comprises four or a multiple of four the at least one y-axis magnetoresistive elements and the z-axis wheatstone bridge circuit comprises four or a multiple of four the at least one z-axis magnetoresistive elements.

12. A single-chip three-axis magnetic field sensing device comprising:
    a substrate including a horizontal surface along an x-y plane;
    an x-axis sensing module, disposed above the substrate, comprising at least one x-axis magnetoresistive element and configured to sense an x-axis magnetic field component substantially parallel to the horizontal surface;
    a second y-axis sensing module, disposed above the substrate, comprising at least one second y-axis magnetoresistive element and configured to sense a second y-axis magnetic field component substantially parallel to the horizontal surface;
    a z-axis sensing module, disposed above the substrate, comprising at least one z-axis magnetoresistive element and configured to sense a z-axis magnetic field component substantially perpendicular to the horizontal surface, wherein the at least one z-axis magnetoresistive element comprising:

a strip of horizontal magnetoresistive layer being substantially parallel to the horizontal surface along the x-y plane;

multiple structurally separated conductive parts parallel one another disposed directly above or directly below the horizontal magnetoresistive layer and electrically coupled thereto, wherein a length direction of all the multiple structurally separated conductive parts are not parallel to a length direction of the horizontal magnetoresistive layer; and a magnetic-field-sensing layer being not parallel to the horizontal surface and extending upward or downward from one side of the horizontal magnetoresistive layer so as to magnetically couple to the horizontal magnetoresistive layer.

13. The single-chip three-axis magnetic field sensing device to claim 12, wherein the at least one x-axis magnetoresistive element, the at least one y-axis magnetoresistive element and the at least one z-axis magnetoresistive element are all disposed directly or directly below a single coil.

14. The single-chip three-axis magnetic field sensing device to claim 12, wherein the z-axis sensing module further comprises another at least one z-axis magnetoresistive element, wherein the at least one z-axis magnetoresistive element and the at least one x-axis magnetoresistive element are disposed directly above or directly below a single coil while the another at least one z-axis magnetoresistive element and the at least one y-axis magnetoresistive element are disposed directly above or directly below another single coil.

15. The single-chip three-axis magnetic field sensing device to claim 12, wherein the horizontal magnetoresistive layer and the magnetic-field-sensing layer both comprises an anisotropic magnetoresistive material (AMR material) whose resistance would change along a change of an external magnetic field.

16. The single-chip three-axis magnetic field sensing device to claim 12, wherein the magnetic-field-sensing layer comprises multiple discrete first sub-portions.

17. The single-chip three-axis magnetic field sensing device to claim 12, wherein the horizontal magnetoresistive layer has pointing, flat or rounded ends.

18. The single-chip three-axis magnetic field sensing device to claim 12, wherein the multiple structurally separated conductive parts comprise multiple first structurally separated conductive sub-portions extending from one side of the horizontal magnetoresistive layer toward the other side of the horizontal magnetoresistive layer and multiple second structurally separated conductive sub-portions extending from the other side of the horizontal magnetoresistive layer toward the one side of the horizontal magnetoresistive layer.

19. The single-chip three-axis magnetic field sensing device to claim 16, further comprising:

another magnetic-field-sensing layer being not parallel to the surface and extending upward or downward from another side of the horizontal magnetoresistive layer so as to magnetically couple to the horizontal magnetoresistive layer.

20. The single-chip three-axis magnetic field sensing device to claim 18, wherein the another magnetic-field-sensing layer comprises multiple second sub-portions, wherein the multiple first sub-portions of the magnetic-field-sensing layer and the multiple second sub-portions of the another magnetic-field-sensing layer are disposed along the length direction of the horizontal magnetoresistive layer alternatively.

21. The single-chip three-axis magnetic field sensing device to claim 12, wherein the horizontal magnetoresistive layer is on a sidewall of a trench.

\* \* \* \* \*